United States Patent [19]

Graham

[11] 4,125,700

[45] Nov. 14, 1978

[54] PREPARATION OF METHYL METHACRYLATE POLYMER POWDERS FOR USE IN PLASTISOLS

[75] Inventor: Boynton Graham, Wilmington, Del.

[73] Assignee: E. I. Du Pont de Nemours and Company, Wilmington, Del.

[21] Appl. No.: 780,088

[22] Filed: Mar. 22, 1977

[51] Int. Cl.$^2$ .......................... C08F 2/50; C08F 2/22; C08K 5/04; C08F 232/00
[52] U.S. Cl. ...................... 204/159.16; 96/86 P; 96/115 R; 260/29.6 PM; 260/31.2 XA; 260/31.8 M; 260/33.8 UA; 260/34.2; 260/31.2 R; 260/31.8 R; 260/31.8 XA; 526/80; 526/317; 526/909
[58] Field of Search .................... 526/80, 317; 260/29.6 PM, 30.6, 31.8 M, 31.8 XA, 31.8 R, 33.8 UA, 34.2, 31.2 XA, 31.2 R; 204/159.16

[56] References Cited

U.S. PATENT DOCUMENTS

| | | | |
|---|---|---|---|
| 2,537,334 | 1/1951 | De Nie | 526/80 |
| 4,025,346 | 5/1977 | Petke et al. | 204/159.16 |

FOREIGN PATENT DOCUMENTS

| | | | |
|---|---|---|---|
| 835,444 | 5/1975 | Belgium. | |
| 686,075 | 5/1964 | Canada | 204/159.16 |
| 2,103,996 | 8/1971 | Fed. Rep. of Germany | 204/159.16 |
| 2,454,235 | 5/1976 | Fed. Rep. of Germany. | |

OTHER PUBLICATIONS

Walbridge et al., Discuss Faraday 42, 294–300, (1966).
Ovchinnikov et al., Trudy, 1972, 51–55, #1.

*Primary Examiner*—Herbert J. Lilling

[57] ABSTRACT

Methyl methacrylate polymer powders especially suitable for making plastisols and organosols are prepared by an improved process comprising stepwise emulsion polymerization in aqueous media in the absence of emulsifiers and surfactants and in such manner that at least most of the monomer added at each step is consumed before the addition of the succeeding portion, followed by isolation of the polymer powder by evaporation of the latex at a temperature that is at least 30° C., preferably 40°–50° C., below the glass transition temperature of the polymer.

17 Claims, No Drawings

PREPARATION OF METHYL METHACRYLATE POLYMER POWDERS FOR USE IN PLASTISOLS

BACKGROUND OF THE INVENTION

1. Field of the Invention

This invention relates to the preparation of polymers, and specifically to an improved process for the polymerization and isolation of methyl methacrylate polymer powders that are especially suitable for dispersion in nonaqueous media to form plastisols and organosols.

2. Description of the Prior Art

Certain polymeric resin dispersions referred to as plastisols are fluid mixtures, ranging in viscosity from pourable liquids to heavy pastes, obtained by dispersing polymeric resin particles in nonvolatile, nonaqueous liquid plasticizers, i.e., materials which are compatible with the polymer or resin and increase its workability and flexibility but are not solvents for the polymer or resin under ordinary conditions of storage. When the plastisol has been formed into a desired shape, e.g., by molding or coating, it can be heated to coalesce the resin or polymer particles and the nonvolatile liquid constituent, thereby forming a homogeneous mass. Volatile diluents can be added to plastisol dispersions to modify their viscosity and to achieve desirable handling characteristics in coating or other forming operations. When the dispersion contains no more than 10% volatile diluent, it is still regarded as a plastisol; when the volatile diluent content exceeds 10%, the dispersion is regarded as an "organosol", H. A. Sarvetnick, "Plastisols and Organosols", Van Nostrand Reinhold Company, New York, New York (1972), page 201.

Theoretically, by appropriate choice of ingredients, any polymeric resin can be made into a plastisol. In practice, however, both the commercial use and the technical literature have focused almost exclusively on the use of polyvinyl chloride in forming plastisols, to the extent that "plastisol" is cross-referenced to "polyvinyl chloride" in *Chemical Abstracts* and in many textbooks plastisols are described as suspensions of polyvinyl chloride resin.

The pre-eminence of polyvinyl chloride in the practical and technical plastisol art results from the fact that many polymers with otherwise highly useful and desirable characteristics can be dispersed in suitable plasticizers only with great difficulty to give dispersions that have impractically high initial viscosities or very short storage life or both. Among these other desirable materials are various polymers and copolymers of methyl methacrylate, which are attractive for a wide variety of uses because of their clarity, toughness, durability, availability, relatively low cost, and ease of forming into desired final products by a number of methods. Despite their many desirable attributes, these polymers and copolymers have found no practical application in the plastisol and organosol arts because it has not been known heretofore how to prepare compositions with suitably low and stable viscosities.

It has now been found that plastisols and organosols with very acceptable rheological properties can be prepared from methyl methacrylate polymer and copolymer powders that have been (a) made by stepwise emulsion polymerization in aqueous media in the absence of emulsifiers and surfactants and in such a manner that most of the monomer added at each step is consumed before the addition of the succeeding portion, and (b) isolated by evaporation of the latex at a temperature that is at least 30° C., preferably 40°–50° C., below the glass transition temperature of the polymer. Particularly advantageous is the use of a stepwise polymerization procedure that entails the presence of "seed" polymer in the aqueous emulsion.

Emulsion polymerization, including stepwise and "seed" polymerization, of methyl methacrylate polymers and copolymers in aqueous media with the help of emulsifiers and surfactants is known. It is also known to use emulsifiers and surfactants when making polyvinyl chloride powders for use in plastisols. In the known plastisol art, based on polyvinyl chloride, it is common practice to dry the polymer powder at a temperature sufficiently high to produce a thin surface skin of fused resin, i.e., at a temperature higher than the glass transition temperature of the polymer, e.g., C. E. Schildknecht, "Polymer Processes", High Polymers, Volume X, Interscience Publishers, Inc., New York (1956), page 558. A two-stage drying procedure for polyvinyl chloride is known, wherein 88-97% of the water is removed in a first step at a temperature higher than the glass transition temperature of the polymer and the remaining water is removed in a second step simultaneously with grinding at a temperature below the glass transition temperature. In contrast to, and simplification of, these prior art practices, the improved process of the present invention omits emulsifiers and surfactants previously thought to be required and accomplishes the drying in a single step at a temperature substantially below the glass transition temperature of the methyl methacrylate polymer or copolymer.

SUMMARY OF THE INVENTION

In accordance with this invention, in an emulsion polymerization process for the preparation of methyl methacrylate polymers and copolymers containing at least 60% by weight of methyl methacrylate units, which comprises (a) adding stepwise in two or more steps with vigorous mixing in water at least one monomer which is methyl methacrylate, together with a polymerization initiator and chain transfer agent whereby at least most of the monomer added in any given step is consumed before the addition of the next succeeding portion, and (b) isolating the resulting polymer; the improvement which comprises the stepwise addition in step (a) occurring in the absence of any emulsifier and surfactant, and the isolation step (b) occurring at a temperature that is at least 30° C. below the glass transition temperature of the polymer product.

DESCRIPTION OF THE PREFERRED EMBODIMENTS

This invention is directed to the preparation of "plastisol-grade" powders of methyl methacrylate polymers, i.e., to polymer powders having molecular weights of about 20,000 to about 325,000 or more, inherent viscosities in the range 0.1–1.5 and more preferably 0.2–1.2, and average particle sizes in the range 0.1–20 $\mu$m and more preferably 0.3–1.0 $\mu$m.

The term "polymer" as used herein includes both homopolymers and copolymers, and the term "copolymer" is not restricted to polymers derived from only two monomeric species but also includes terpolymers, tetrapolymers, and the like. The preferred polymers comprise at least 60%, more preferably at least 80%, by weight methyl methacrylate units. Particularly preferred comonomers to be used with methyl methacrylate are acrylic and methacrylic acids and the lower alkyl esters thereof; more particularly preferred copolymers are methyl methacrylate/methacrylic acid in the ratios, by weight, of 80/20 to 99/1 and still more preferably 90/10 to 98/2. Also suitable and preferred are other monomers having lateral carboxylic, sulfonic, or phosphoric acid groups, especially such unsaturated carboxyl-containing monomers as cinnamic, crotonic, sorbic, itaconic, propiolic, maleic and fumaric acids and, where possible, their corresponding half-esters and anhydrides. The selection of monomeric components, and their relative proportions in copolymers, will be determined by such factors as (a) the properties desired in the final product that is to be made from the plastisol or organosol, (b) cost, (c) availability, (d) the ease with which they can be handled in the various process steps to be used, and (e) their compatibility with the plasticizers and other constituents intended to be used.

Molecular weight and inherent viscosity are not critical factors in the present invention, However, for convenient practical operation in plastisols, the inherent viscosity ($\eta_{inh}$) of the polymer will preferably be in the range 0.1–1.5 and more preferably 0.2–1.2. When polymer viscosity is high, the plastisol dispersion will be more difficult to coalesce; when polymer viscosity is low, the form stability of the final coalesced product may be affected adversely.

Particle size, expressed as mean diameter of the particles, is likewise not critical, but for convenient practical operation will preferably be in the range 0.1–20 μm and more preferably 0.3–1.0 μm. The desirable particle size in a given instance will be governed in part by the characteristics sought in the final product and by the forming procedure to be employed. Very large particles may limit the minimum thickness of coatings that can be made from dispersions containing them, and may also require fusion or coalescence times that are unattractively long and/or severe. Very small particles, e.g., <0.1 μm, are operable, but their large available surface area tends to make them susceptible to rapid gelation with consequent short storage life, and to require large amounts of plasticizer that result in low solids/liquid ratios that are inefficient and undesirable for practical operations. Particle sizes in the desired range in a give instance may be obtained either directly from the polymerization process of the invention, or by grinding or milling large particles to produce smaller ones, in equipment and by techniques known in the art.

The emulsion polymerization procedure can be carried out with known apparatus and techniques following basically the principles known to those skilled in the art, i.e., vigorous mixing of monomer, polymerization initiator, and chain transfer agent in water, preferably with the exclusion of oxygen. However, according to the invention, the polymerization step is carried out stepwise by the addition of successive portions of monomer in such manner that most, and preferably substantially all, of the monomer added at a given step is consumed before the addition of the next succeeding portion. Preferably, but not necessarily, the polymerization is carried out at a ratio of about 17 parts by weight of monomer to about 83 parts by volume of water. In the stepwise procedure, there should be at least two, and preferably five, separate portions of monomer, i.e., at least one and preferably four successive additions. Preferably, but not necessarily, the portions are of equal amount. When the stepwise procedure is used to make copolymers, each portion will preferably, but not necessarily, contain the comonomers in the same ratio; this ratio will be the ratio desired in the final copolymer product.

The polymerization initiator will be chosen from those known in the art as suitable for the monomers being used, and will be employed in the amounts known in the art. Since a large excess of initiator in the early stages may result in undesirably low molecular weights, it will generally be preferable to have only part of the total required initiator in the starting mixture, and to add the remainder portionwise as part of each successive addition of monomer. Likewise, the chain transfer agent will be selected from those known in the art as suitable for the monomers being used, and will be used in the amounts known in the art. A preferred group of chain transfer agents are alkyl mercaptans of at least 10 carbon atoms and particularly preferred is dodecyl mercaptan.

It is particularly preferred that the stepwise polymerization process be a "seed" polymerization process, wherein particles of previously prepared polymer are included in the starting mixture to serve as loci for the growth of new polymer particles. Such "seed" polymer should be included only in the first step and not in the successive additions. The amount of seed to be used may be in the range 0.5–10%, with an optimum at about 2%, by weight of the total amount of final polymer expected to be produced. The seed polymer may have the same composition as that of the final polymer to be made, or it may have a different composition provided that it is derived from related monomeric species, e.g., a methyl methacrylate homopolymer can be used as seed for the production of methyl methacrylate/methacrylic acid copolymer. The requirements to be met are that the monomer must be able to dissolve in the seed and the resultant copolymers must be compatible. It is also generally preferred that the seed polymer used be a "first generation" polymer, i.e., it should not itself be the product of a previous seed polymerization. Seeded polymerizations generally give bimodal distributions of particle size that lead to the most desirable plastisol rheology.

When the emulsion polymerization of methyl methacrylate polymer is carried out in stepwise fashion in the manner just described, it has been found that it it not only possible, but, in fact, surprisingly desirable to omit the emulsifiers or surfactants that have been considered essential in the prior art. As will be seen in greater detail in the examples hereinafter, although polymerization can be conducted with apparent success in aqueous media containing emulsifiers and surfactants, the resulting polymer powders do not disperse as readily in plasticizers as do polymer powders made without emulsifiers and surfactants, and the resulting plastisols are frequently difficult to filter and to coat. Consequently it is also a feature of the process of the invention that the emulsion polymerization is conducted without the heretofore conventional emulsifiers and surfactants.

Upon completion of polymerization, according to the invention, the polymer is isolated directly, i.e., without filtration, by evaporation of the latex. This step can be carried out at room temperature, but is advantageously and preferably conducted at elevated temperature, provided that the temperature is at least 30° C., and preferably is 40°–50° C., below the glass transition temperature of the polymer. The rate of evaporation can be accelerated by stirring the latex as it dries, and by carrying out the evaporation, with or without stirring, in the presence of a moving stream of gas, especially an inert gas, e.g., nitrogen. Spray-drying is a particularly convenient and effective technique for isolating the polymer powder.

The polymer particles produced according to the process of this invention can be used to make thermally coalescible plastisols and organosols by dispersing them in a medium that comprises a plasticizer for the polymer particles, that is, a surfactant-free compatible liquid that is nonvolatile at room temperature and is not a solvent for the polymer under ordinary storage conditions, but that is capable of interacting physically with the polymer in such a way as to reduce the mutual attractive forces between polymer chains, thereby increasing the workability and flexibility of the polymer. The plasticizer is also not a monomer of any of the polymeric components. Many suitable plasticizers are known in the art, e.g., triallyl, tributyl and tricresyl phosphates; dibutyl, dicapryl and dioctyl phthalates, etc. Plasticizers that contain ether groups are operable, but generally are not preferred because they appear to have an adverse effect on viscosity stability and shelf life of the polymer dispersions.

The dispersing medium may also contain a volatile component, preferably one that is a solvent or swelling agent for the polymer component of the dispersion. Incorporation of a volatile component provides an additional means of controlling the viscosity of the dispersion and may frequently facilitate the forming operation, e.g., coating, and improve the rheology of the dispersion. Representative suitable materials are methyl chloroform, chloroform, methylene chloride, and others shown in the examples. Following known practice, dispersions wherein the volatile component comprises up to 10% by weight of the total weight of the dispersion are regarded herein as plastisols, whereas dispersions wherein the volatile component comprises more than 10% by weight of the total weight of the dispersion are regarded as organosols.

The loading factor or amount of polymer solids in the liquid dispersing medium will be governed by practical factors relating to operating convenience. For coatability, ease of stirring, and the like, a practical upper limit for the solids/nonvolatile liquid ratio is 60/40, and more preferred is about 50/50, for plastisol dispersions. This consideration is less important for the organosol dispersions where solids/nonvolatile liquid ratios of 80/20 and even 90/10 are feasible, inasmuch as any desired amount of volatile component can be incorporated to give a workable viscosity and then removed by evaporation by heating in the course of arriving at the desired temperature for fusing or coalescing the dispersion.

The plastisols and organosols may be formed into articles by any of the forming procedures ordinarily used, e.g., by coating, extrusion, molding, and dipping, and then heated in known manner at a temperature and for a time sufficient to cause the polymer particles and the nonvolatile liquid constituents to coalesce to a homogeneous mass.

When the polymer is a methyl methacrylate copolymer that incorporates an acidic comonomer, it will frequently be found that plastisol rheology can be improved by converting the polymer to a polyelectrolyte, that is, to its basic salt, e.g., alkali metal salt, ammonium salt, or amine salt, by treatment with alkali metal hydroxides, ammonium hydroxide, gaseous $NH_3$, dimethyl cocoamine, triethylamine, dimethyloctylamine, triethanolamine, triethylene tetramine, and the like. Such treatment can be carried out on the isolated powder before its combination with the plasticizer, or it can be done in situ by incorporating suitable ionogenic reactants with the plasticizer and optional other ingredients with which the polymer will be mixed to form the final plastisol or organosol dispersion.

The polymer powders made by the process of this invention are particularly suitable for the preparation of photosensitive plastisols and organosols, wherein the liquid portion of the dispersion contains a nonvolatile, photopolymerizable, ethylenically unsaturated compound together with any required or desired photoinitator component(s), chain transfer agents, hydrogen donors, dyes and other conventional additives, all selected from the many materials known for their respective purposes in the photopolymer art. Among the preferred photopolymerizable monomers are a number of polyfunctional acrylic and methacrylic monomers, such as tetraethylene glycol diacrylate and dimethacrylate, hexamethylene glycol diacrylate and dimethacrylate, polyethylene oxide diacrylate and dimethacrylate, polyethoxy trimethylolpropane triacrylate, trimethylolpropane triacrylate and trimethacrylate, tetramethylene glycol dimethacrylate, and decamethylene glycol dimethacrylate. Monomers that contain ether groups are operable, but ether-free monomers are preferred for viscosity stability of the plastisol. When a photopolymerizable acrylic monomer is used, it should preferably not be a monomer of any of the already-polymerized component, i.e., the polymer resin that is dispersed in the liquid component, in order to insure against excessive plasticization and consequent gelation at storage temperatures. It is important that any photopolymerizable monomer that may be included in the dispersion shall also contain a thermal polymerization inhibitor in an amount adequate to prevent premature polymerization of the monomer in response to the heat that may be encountered in stirring and especially in the coalescence step, thereby insuring that polymerization of the monomer occurs only when wanted as a consequence of photoexposure of the completed photosensitive element. The commercially available polymerization-grade monomers conventionally contain thermal polymerization inhibitors in an amount adequate for this purpose. The photosensitive plastisol or organosol dispersions can be cast or extruded to form self-supporting photosensitive elements, or they can be cast or coated on transparent or nontransparent substrates to form supported photosensitive elements. Substrates, when used, can be selected from the many suitable and conventional materials known in the art, e.g., glass, metal sheets and plates, plastic sheets and films, and the like.

The process of the present invention provides an improved route to highly desirable methyl methacrylate polymers that are suitable for use in plastisols and organosols for a variety of purposes. The improved process offers wide latitude in choice of starting materials, operating procedures, properties of polymer produced, and the like, all with economies of time and effort over prior art methods. Plastisols and organosols based on methyl methacrylate polymers have utility in a broad spectrum of uses, notably those where their clarity and toughness can be used to advantage. A particularly useful application is in photosensitive elements for use in relief and planographic printing plates, in photoresists for the manufacture of printed circuits, and the like.

EXAMPLES OF THE INVENTION

The invention will be illustrated by the examples that follow, wherein parts and percentages are by weight unless otherwise noted. Data on the inherent viscosity of polymers ($\eta_{inh}$) refer to the inherent viscosities of solutions of 0.25 g polymer in 50 ml solvent, either chloroform or 50/50 (by volume) chloroform/methanol, measured at 25° C. with a No. 50 Cannon-Fenske viscometer. Particle size values are mean particle diameters determined by inspection of photomicrographs or electron micrographs. Dispersion viscosities, reported in centripoises (cps.) were measured with a Brookfield RVT viscometer with a No. 5 spindle. All monomers used in the examples, either to make the polymers or to serve as photopolymerizable monomers in photosensitive compositions, were commercially available polymerization-grade monomers containing conventional amounts of polymerization inhibitors. Dyes are identified by C. I. name and number as given in "Colour Index", Third Edition, The Society of Dyers and Colourists, Bradford, Yorkshire, England (1971). Values for glass transition temperature ($T_g$) were determined in known manner by differential scanning calorimetry. Performance of photosensitive elements were measured by exposing them through a conventional graphic arts resolution guide, i.e., a series of transparent parallel lines of known width in a nontransparent background, and a series of transparent converging lines separated by nontransparent spacing areas of known width, then removing the unpolymerized composition from the unexposed areas. Performance is expressed in the examples in terms of the minimum width of polymerized parallel lines that could be faithfully reproduced, and of the minimum spacing that could be obtained without plugging between polymerized converging lines. Filters and sieves are identified in terms of mesh (number of openings per inch) and sieve opening (mm or μm) according to Table 21-16 on page 21-51 of Perry, "Chemical Engineers' Handbook", Fourth Edition, McGraw-Hill Book Company, New York (1963).

EXAMPLE 1

To a solution of 0.4 g ammonium persulfate in 200 g of water was added 18 ml of a solution of 1.09 g dodecyl mercaptan and 10.0 g methacrylic acid in 100 g methyl methacrylate. The suspension was stirred vigorously under nitrogen and heated to 80°–85° C. At 30-minute intervals, there was added 25 ml of the methyl methacrylate/methacrylic acid/dodecyl mercaptan solution and 112 ml of a solution of 0.2 g ammonium persulfate in 450 g water. Thirty minutes after the fourth such addition, the reactor was opened to air and cooled to room temperature. The latex that had been produced was evaporated at 55°–66° C. under nitrogen with stirring, and the residual powder ($T_g = \sim 130°$ C.) was ground in a mortar, passed through a 40-mesh (~0.38 mm) sieve, and held for 3 days in a closed container over concentrated ammonium hydroxide. The powder was soluble at room temperature in chloroform and 1,1,2-trichloromethane; partly soluble, swollen and agglomerated in methylene chloride, 1,2-dichloroethane, trichloroethylene and 1,2,3-trichloropropane. It was swollen by insoluble in methyl chloroform, perchloroethylene and carbon tetrachloride. It was insoluble and not swollen in hexane.

(a) A plastisol was prepared by mixing equal parts by weight of the powder, prepared as just described, with dibutyl phthalate. The resultant soft translucent paste was spread at 1 mm thickness on glass and coalesced by heating for 5 minutes at 120° C. to give a clear, dry, soft, pliable film.

(b) One part of polymer powder prepared as just described was mixed with 0.6 part of a commercially available polyoxyethylated long chain alcohol, 0.2 part of a commercially available polyoxyethylene sorbitan monolaurate, and 0.2 part of methylene-bis-(4-cyclohexyl isocyanate). The resultant white paste was spread on glass at 1 mm thickness and heated for 5 minutes at 120° C. It coalesced to give a clear, soft film that swelled 12.5% by volume when immersed in 5% aqueous sodium carbonate. This sample illustrates a crosslinkable formulation suitable for use as a binder for silver halide photographic systems.

(c) Other dispersions illustrate useful upper limits for loading factor for acrylic resin plastisols, and they also show that, for a given polymer and plasticizer, relatively small changes in the solids/liquid ratio can have a rather large effect on plastisol rheology. In addition, these dispersions showed a decrease in viscosity upon aging that has been found to be characteristic of plastisols made from methyl methacrylate/methacrylic acid (90/10) copolymers. For these dispersions, polymer powder like that already described was mixed with dibutyl phthalate by conventional high-speed sand-milling procedures. All formulations also contained 0.2% benzotriazole and 0.07% C. I. Solvent Red 109 (C. I. No. 13900/45170). Good filterability was achieved by adding a small amount of methyl chloroform, which was subsequently removed by evacuation after filtration to give essentially solvent-free plastisols. Viscosities of the dispersions were determined at high and low shear by varying the rotational velocity of a No. 5 spindle in a Brookfield RVT viscometer, both for the freshly prepared plastisols and again after aging at room temperature, with these results:

| | Sol/liq. | | | | |
|---|---|---|---|---|---|
| | 58/42 | | 59/41 | | 60/40 |
| Visc., cps. | Initial | Aged 1 day | Initial | Aged 3 days | Initial |
| at 50 rpm | 6,000 | 2,576 | — | — | — |
| 20 rpm | 7,780 | 2,040 | 16,200 | 2,000 | — |
| 10 rpm | 11,600 | 2,720 | 20,240 | 2,400 | — |
| 5 rpm | 17,600 | 3,760 | 30,240 | 3,440 | 40,000 |
| 1 rpm | — | — | 105,000 | 9,600 | — |

The 60/40 plastisol was very shear-sensitive and set to a firm paste at room temperature when stirred rapidly. The 58/42 and 59/41 plastisols were dilatant at high shear and thixotropic at low shear; they were cast and coalesced as described above to give clear, pliable films.

EXAMPLE 2

To a solution of 0.4 g ammonium persulfate in 50 ml water was added 20 ml of a solution of 1.1 g dodecyl mercaptan plus 11 g methacrylic acid in 100 g methyl methacrylate. The suspension was stirred vigorously under nitrogen and heated to 80°–99° C. Further additions of 25 ml of the methyl methacrylate/methacrylic acid/dodecyl mercaptan solution and of 112 ml of a solution of 0.2 g ammonium persulfate in 450 ml of water were made at intervals of 10, 21, 14 and 45 minutes. After a further 90 minutes at 80°–99° C., the latex was strained through nainsook fabric and evaporated at 65°–95° C. for 2.75 hours in air. The residue amounted to 93% of the theoretical yield, and had these properties: acid number = 63.7; $T_g$ = 130° C., $\eta_{inh}$ = 0.37. It was ground in a mortar to an impalpable powder that was stored for about 20 hours in a closed container over aqueous ammonium hydroxide.

An organosol was prepared by mixing 11.1 g of the powder prepared as just described, 8.75 g trimethylolpropane trimethacrylate, 2.0 g tricresyl phosphate, 1.0 g bis(2-o-chlorophenyl-4,5-diphenyl)imidazole, 0.05 g leuco crystal violet, 0.05 g benzotriazole, 0.0375 g C. I. Solvent Red 109, 0.0125 g Michler's ketone, 6 ml methylene chloride and 23 ml of 20–30 mesh (~0.55–0.85 mm) sand, and milling for 30 minutes at 0° C. with a disc impeller running at a peripheral speed of 1000 ft./min. (~300 m/min.). The organosol was then filtered through a 200-mesh (0.074 mm) screen, coated at 0.004 inch (0.1 mm) clearance on 0.001 inch-thick (0.025 mm) polyethylene terephthalate film, and heated for 5 minutes at 120° C. to give a film that was nontacky and resistant to cold flow. The organosol was still fluid after storage for 20 hours at room temperature open to the air.

In contrast, a similar polymerization wherein 0.00007 g sodium lauryl sulfate was incorporated in the reaction medium gave a plastisol that was difficult to disperse and spread. When 0.5 g sodium lauryl sulfate was used, the plastisols were even more difficult to disperse and could not be filtered.

EXAMPLE 3

To a solution of 0.6 g ammonium persulfate in 500 g of water was added 19 ml of a solution of 11 g methacrylic acid plus 1.1 g dodecyl mercaptan in 100 g methyl methacrylate. The suspension was stirred vigorously under nitrogen and heated at 80°–85° C. After 12 minutes, when the initial exotherm had subsided, the remainder of the methacrylic acid/dodecyl mercaptan/methyl methacrylate solution was added dropwise over a period of 8 hours. After further heating and stirring for 30 minutes, the resultant latex was evaporated under nitrogen with stirring at 56°–65° C. The residual powder weighed 100 g and comprised agglomerates of 0.3 μm spheres. It was comminuted in a mortar, held for 24 hours at room temperature over concentrated aqueous ammonium hydroxide and then dried for 24 hours at room temperature over sodium hydroxide pellets. Weight gain was 1.6%, i.e., 70% of the theoretical amount for complete conversion of all —COOH groups to —COONH$_4$ groups. For the treated powder, $T_g$ = ~130° C. Predrying of the ammonia-treated powder is advantageous for preparation of plastisols with best filterability and lowest ultimate viscosity. In general, such predrying should be carried out for a period at least as long as was the previous NH$_4$OH treatment.

The powder so prepared was used to make an organosol containing 11.1 g of the powder, 8.75 g trimethylolpropane triacrylate, 2.0 g tricresyl phosphate, 1.0 g bis(2-o-chlorophenyl-4,5-diphenyl)imidazole, 0.05 g leuco crystal violet, 0.05 g benzotriazole, 0.0375 g C. I. Solvent Red 109, 0.0825 g Michler's ketone and 5 ml chloroform diluent. The sand-milling procedure of Example 2 was followed with the added precaution that the mixture was protected from ambient humidity by blanketing with dry nitrogen during the 0° C. milling step. This precaution served to improve filterability and reduce ultimate viscosity. After pressure-filtering through nylon flannel, the organosol had a viscosity of 200 cps. (Brookfield, No. 5 spindle, 100 rpm). It was then held under oil-pump vacuum at room temperature. After 20 minutes, the bubbles and diluent had been removed, and the final vacuum was 2 mm Hg. The residual plastisol was dilatant, with Brookfield No. 5 viscosities of 1176 cps. at 100 rpm and 832 cps. at 50 rpm. It was again pressure-filtered through nylon flannel and then coated at a thickness of 0.002 inch (0.05 mm) on 0.001 inch-thick (0.025 mm) polyethylene terephthalate film and coalesced by passage at 12 ft./min. (3.6 m/min.) through a 12-foot (3.6 m) drying oven held at 212° F. (100° C.). The resulting 0.002 inch-thick (0.05 mm) coating was smooth and uniform.

The film so produced was laminated at 100° C. to a copper-foil-coated phenolic circuit board and exposed through a graphic arts resolution guide as previously described for one minute to radiation from a commercially available pulsed xenon source. The polyethylene terephthalate support was then removed, and the exposed coating was developed by extracting with a solution of 10 g of the monobutyl ester of ethylene glycol plus 1 g of borax in 90 g of water. The exposed areas had good image retention. Isolated lines having a width of 0.004 inch (0.1 mm) were reproduced, and there was no line plugging at resolutions of 0.003–0.004 inch (0.075–0.1 mm). The board was clearly and sharply etched with commercial ferric chloride etchant solutions, and stripped with methylene chloride.

The plastisol was stable for many months at room temperature without significant increase in viscosity, yet was readily coalesced when heated to 100°–120° C.

EXAMPLE 4

To a solution of 0.4 g ammonium persulfate in 200 g water was added 23.4 ml of a solution of 4.0 g dodecyl mercaptan in 100 g methyl methacyrlate. The suspension was blanketed with nitrogen, stirred vigorously, and heated at 80°–85° C. At 30-minute intervals, there was added 20 ml of the methyl methacrylate/dodecyl mercaptan mixture plus 112 ml of a solution of 0.2 g ammonium persulfate in 450 g water. Thirty minutes after the fourth addition, the reaction was terminated by admitting air and cooling to room temperature. The product was strained through nainsook fabric and held as a "seed latex".

To a solution of 0.4 g ammonium persulfate in 364 g water was added 36.2 g of the methyl methacrylate homopolymer "seed latex" produced as just described and 32 ml of a solution of 4.0 g dodecyl mercaptan plus 1.0 g methacrylic acid in 99 g methyl methacrylate. The suspension was blanketed with nitrogen, stirred vigorously, and heated at 80°–85° C. At 30-minute intervals, there was added 20 ml of the dodecyl mercaptan/methacrylic acid/methyl methacrylate solution plus 25 ml of a solution of 0.2 g ammonium persulfate in 100 g of water. Thirty minutes after the fourth addition, the reaction was terminated and the resultant latex was strained through glass wool and evaporated at 60°–70° C. under a stream of nitrogen with stirring. The copolymer powder so produced was methyl methacrylate/methacrylic acid (~99/1), $T_g$ = 103° C. It was easily comminuted and was used to prepare low-viscosity plastisols.

EXAMPLE 5

A mixture of 61.0 g methyl methacrylate, 31.0 g ethyl acrylate, 8.0 g methacrylic acid and 0.6 g ammonium persulfate in 500 ml water was heated for two hours at 80°–85° C. in a one-step preparation of terpolymer of methyl methacrylate/ethyl acrylate/methacrylic acid in the approximate ratios of 61/31/8. The reaction mixture was cooled, strained through nainsook fabric, and held as "seed latex 1".

To a solution of 0.4 g ammonium persulfate in 370 ml water was added 30 ml of "seed latex 1" prepared as just described (equal to 5 g of seed polymer) and 20 ml of a mixture of methyl methacrylate/ethyl acrylate/methacrylic acid monomers in weight ratio 61/31/8. The suspension was stirred vigorously under nitrogen and heated to 80°-85° C. At 30-minute intervals there was added 25 ml of a solution of 0.2 g ammonium persulfate in 100 ml water and 20 ml of the 61/31/8 monomer mixture. Thirty minutes after the fourth addition, the reaction mixture was cooled to room temperature, strained through nainsook fabric, and held as "seed latex 2".

To a solution of 0.4 g ammonium persulfate in 380 ml water there was added 11.8 g of "seed latex 2" (equals 2.5 g of seed polymer) and 26.5 ml of a mixture of methyl methacrylate/ethyl acrylate/methacrylic acid monomers in weight ratio 65/25/10. The suspension was stirred vigorously under nitrogen and heated at 80°-88° C. At 30 minute intervals, there was added 25 ml of a solution of 0.2 g ammonium persulfate in 100 ml water and 20 ml of the 65/25/10 monomer mixture. Thirty minutes after the fourth such addition, the reaction was terminated, and the reaction mixture was cooled, strained through glass wool, and evaporated at room temperature for 5 days under nitrogen with stirring to give 102 g (97% of theoretical yield) of terpolymer powder with $T_g = 74°$ C. The powder was ground in a mortar, passed through a 40-mesh ($\sim 0.38$ mm) screen, stored for 20 hours in a closed container over aqueous ammonium hydroxide, and was readily made into plastisols and organosols in formulations like those shown in preceding examples.

A similar copolymer that was isolated by drying the latex at 100° C. coagulated to a hard lump that could not be comminuted. A similar copolymer that was isolated by drying the latex at 55°-60° C. coalesced and was very difficult to comminute and gave plastisols that were difficult to mill and filter. Thus, while it is possible to isolate plastisol-grade powders at temperatures as high as 14° C. below the glass transition temperature, it is preferable to carry out the isolation at a temperature at least 30° C. below the glass transition temperature of the polymer.

EXAMPLE 6

A solution of 0.4 g ammonium persulfate in 200 g of water was stirred vigorously under nitrogen. To this was added 23 ml of a solution of 4.0 g dodecyl mercaptan in 100 g methyl methacrylate and the suspension was heated to 80°-85° C. At intervals of 30 minutes, there was further added 20 ml of the dodecyl mercaptan/methyl methacrylate solution and 112 g of a solution of 0.2 g ammonium persulfate in 400 water. Thirty minutes after the fourth such addition, the reaction was terminated by admitting air and cooling to room temperature. The latex was dried for 20 hours at 60°-70° C. under a stream of nitrogen with stirring and the resultant methyl methacrylate homopolymer powder ($T_g = 99°$ C.) was ground in a mortar and passed through a 40-mesh ($\sim 0.38$ mm) screen. It was used to make an organosol that comprised 13.75 g of the polymer powder, 8.75 g trimethylolpropane triacrylate, 2.125 g triethylene glycol diacetate, 0.08 g Michler's ketone, 0.165 g benzophenone, 0.025 g benzotriazole, 0.11 g C. I. Solvent Red 109, and 10 ml carbon tetrachloride. The organosol was passed through a 200-mesh (0.074 mm) screen, then coated, coalesced, laminated, imaged, developed and stripped as described in Example 3.

EXAMPLE 7

A solution of 0.4 g ammonium persulfate in 400 g water was stirred vigorously under nitrogen. To it was added 27 ml of a solution of 10 g methacrylic acid plus 0.92 g dodecyl mercaptan in 90 g methyl methacrylate and the suspension was heated to 80°-85° C. At intervals of 30 minutes, there was added 20 ml of the methyl methacrylate/methacrylic acid/dodecyl mercaptan solution plus 25 g of a solution of 0.2 g ammonium persulfate in 100 g water. Thirty minutes after the fourth such addition, the reaction was terminated by admitting air and cooling to room temperature. The latex was dried for 20 hours at 55°-66° C. under a stream of nitrogen with stirring. After storage in a closed container for 20 hours over aqueous ammonium hydroxide, the resulting powder ($T_g = \sim 130°$ C.) was used to make an organosol in the same formulation as that of Example 2 except that the diluent was 5 ml of methyl chloroform in place of 6 ml of methylene chloride. The fluid, stable organosol was coated at a thickness of 0.0015 inch ($\sim 0.038$ mm) on 0.001 inch-thick (0.025 mm) polyethylene terephthalate film and passed at 12 ft./min. (3.6 m/min.) through a 12-foot (3.6 m) drying oven maintained at 208° F. ($\sim 98°$ C.). The resultant coalesced coating was smooth, dry and tough. It was laminated, imaged, developed, etched and stripped as previously described.

Substantially similar results were obtained when similar stepwise polymerizations were carried out with intervals between monomer additions of 60, 45, 15 and 10 minutes. When the polymerization was carried out in one step, with all ingredients present from the start, the resulting organosols could not be filtered through 100-mesh (0.149 mm) screens, even after aging for two days at room temperature. When similar polymer was made with two 50 ml additions of the methyl methacrylate/methacrylic acid/dodecyl mercaptan solution, filterability of the resultant organosols was not as good as with the preferred procedure of four additions of 25 ml portions.

When a similarly prepared latex was dried at 83°-88° C., it partially coagulated and was very difficult to grind and disperse. Since the polymer had $T_g = \sim 130°$ C., it is thus demonstrated that such latices should be dried at a temperature at least 30° C., and preferably 40°-50° C., below the glass transition temperature of the polymer. Lower temperatures are operable, but require correspondingly longer drying times.

Similarly, a methyl methacrylate/methacrylic acid (95/5) copolymer, with a glass transition temperature of 113° C. was isolated from the latex as a friable powder by drying at 70° C., but it coalesced when dried at 100° C.

EXAMPLE 8

To a solution of 0.4 g ammonium persulfate in 400 g water was added 27.29 ml of a solution of 1.02 g dodecyl mercaptan, 5 g ethyl acrylate and 10 g methacrylic acid in 85 g methyl methacrylate. The suspension was stirred vigorously under nitrogen and heated for thirty minutes at 80°-85° C. At 30-minute intervals, there was added 25 ml of a solution of 0.2 g ammonium persulfate in 100 g water and 20 ml of the dodecyl mercaptan- /ethyl acrylate/methacrylic acid/methyl methacrylate solution. Thirty minutes after the fourth such addition, the reactor was opened to air and cooled to room temperature. The latex was evaporated at 55°–66° C. for 20 hours under nitrogen with stirring to yield a terpolymer powder ($T_g$ = 115° C.) of methyl methacrylate/ethyl acrylate/methacrylic acid (85/5/10). The powder was ground in a mortar, passed through a 40-mesh (~0.38 mm) sieve, treated with ammonia as previously described, and used to make an organosol in the formulation given in Example 7, which was milled, filtered, coated, coalesced, laminated, imaged, developed, etched and stripped as previously described.

EXAMPLE 9

Polymer Preparation: A methyl methacrylate/methacrylic acid (98/2) copolymer powder was prepared by procedures substantially like those of Example 2, using 98 g methyl methacrylate, 2.0 g methacrylic acid and 2.0 g dodecyl mercaptan. The polymer powder was isolated by drying at 63° C., then it was held for 19 hours over concentrated aqueous ammonium hydroxide and dried for 21 hours over sodium hydroxide pellets. Weight gain indicated that 0.5% $NH_3$ was combined. Examination in the electron microscope indicated a particle size of 0.2–0.4 μm. The powder ($T_g$ = ~122° C.) was partly soluble at room temperature in methyl chloroform, and was swollen but insoluble in perchloroethylene.

Liquid Premix: A mixture of 29.0 g trimethylolpropane triacrylate, 4.3 g dioctyl phthalate, 4.3 g triethyleneglycol diacetate, 4.3 g tricresyl phosphate, 4.0 g bis(2-o-chlorophenyl-4,5-diphenyl)imidazole, 0.2 g benzotriazole, 1.0 g Michler's ketone, 0.3 g tris(4-diethylamino-o-tolyl)methane, 0.11 g leuco crystal violet, 0.03 g C. I. Basic Blue 7 (C.I. No. 42595) and 31.8 g methyl chloroform was stirred for 18 hours at room temperature, then pressure-filtered through nylon flannel.

Preparation of Organosol: A mixture of 19.95 g of the above liquid premix, 13.0 g of the above binder powder, and 25 ml of 20–30 mesh (~0.55–0.85 mm) sand was milled for 30 minutes at 0° C. under nitrogen, then pressure-filtered at 0° C. The organosol had a viscosity at 0° C. of 10,320 cps. initially, 3600 cps. after 5 hours at 5° C., and 4600 cps. after 22 hours at 5° C. When held at room temperature, viscosity was 36,800 cps. after one hour and >800,000 cps. after two hours. The organosol was used for the preparation of photoresists as described in preceding examples.

When similar polymer powders were isolated by drying at 100° C., they coalesced to hard lumps that could not easily be ground. Since this polymer had $T_g$ = ~122° C., it is demonstrated that it is preferable to carry out the polymer isolation step at a temperature at least 22° C. below the $T_g$ of the polymer.

EXAMPLE 10

To a solution of 0.4 g ammonium persulfate in 400 g water was added 28.6 ml of a solution of 20 g methacrylic acid plus 1.07 g dodecyl mercaptan in 80 g methyl methacrylate. The suspension was stirred vigorously under nitrogen and heated at 80°–85° C. At 30-minute intervals, there was added 20 ml of the methyl methacrylate/methacrylic acid/dodecyl mercaptan solution plus 25 ml of a solution of 0.2 g ammonium persulfate in 100 ml water. Thirty minutes after the fourth such addition, the reaction was terminated by admitting air and cooling to room temperature. The latex was dried at 55°–66° C. under a stream of nitrogen with stirring, and the residual powder was ground in a mortar, passed through a 40-mesh (~0.38 mm) screen and held for 20 hours in an atmosphere of ammonia. The powder ($T_g$ = >130° C.) was soluble in the monobutyl ether of ethylene glycol. It was insoluble in methyl chloroform, carbon tetrachloride, chloroform, methylene chloride, and perchloroethylene. It was used to make organosols in formulations like those of preceding examples.

EXAMPLE 11

To a solution of 0.4 g ammonium persulfate in 100 g water there was added 21 ml of a solution of 1.76 g dodecyl mercaptan in 88 g methyl methacrylate. The suspension was stirred vigorously under nitrogen and heated to 80°–90° C. After 21 minutes at 80°–90° C., there was added 25 ml of the dodecyl mercaptan/methyl methacrylate solution plus 112 ml of a solution of 0.2 g ammonium persulfate in 450 ml water. Two further such additions were made at 15-minute intervals. After a further 15 minutes, a final addition was made of 112 ml of the 0.04% aqueous ammonium persulfate plus a solution of 0.44 g dodecyl mercaptan plus 2.2 g methacrylic acid in 19.8 g methyl methacrylate. These ingredients and amounts were designed to give methyl methacrylate/methacrylic acid (98/2) particles, each comprising a core of poly(methyl methacrylate) and a skin of poly(methyl methacrylate/methacrylic acid) (90/10).

After a further 15 minutes at 81°–83° C., the latex was evaporated at 55°–67° C. The solid residue weighed 108.6 g (96% yield). It was ground in a mortar, held one day over concentrated aqueous ammonium hydroxide, then dried for one day over sodium hydroxide pellets. Weight gain was 0.37%.

The powder ($T_g$ = ~122° C.) was used to make an organosol in the formulation given in Example 9. The organosol had a viscosity at 0° C. of 400 cps. initially and 1000 cps. after 5 hours at 5° C., and 720–2068 cps. after 24 hours at 5° C. It was coated and used for photoresists in the manner previously described.

EXAMPLE 12

To a solution of 0.55 g ammonium persulfate in 436 g water was added 94 ml of a solution of 11 g methacrylic acid plus 1.1 g dodecyl mercaptan in 100 g methyl methacrylate. The suspension was blanketed with nitrogen, stirred vigorously, and heated at 80°–93° C. for 31 minutes. Then there was added a further 25 ml of the methyl methacrylate/methacrylic acid/dodecyl mercaptan solution plus a solution of 0.05 g ammonium persulfate in 112 ml water. After a further 10 minutes at 85° C., the latex was dried with stirring under nitrogen at 59°–66° C. The residue weighed 109.8 g (97.4% yield). It was ground in a mortar, held for 3 days over concentrated aqueous ammonium hydroxide, then held for 4 days over sodium hydroxide pellets. The powder ($T_g$ = ~130° C.) was used to make stable, low-viscosity plastisols in formulations like the organosol formulation of Example 2 but omitting the methylene chloride diluent. This example illustrates that good plastisol-forming powders can be prepared in a simple two-step polymerization procedure, provided that the second (or last) step entails the addition of 10–30%, preferably about 20%, of the total monomer charge after the initial reaction has subsided.

EXAMPLE 13

To a solution of 0.2 g ammonium persulfate in 67 ml water was added 20 ml of a monomer mixture comprising 100 g methyl methacrylate, 11 g methacrylic acid and 2.2 g dodecyl mercaptan. The suspension was stirred under nitrogen and heated to 80°-89° C. for 22 minutes, then at 10-minute intervals there were made four additions, each comprising 25 ml of the monomer mixture as described and 83 ml of a solution of 0.1 g ammonium persulfate in 333 ml water. After a final 10 minutes at 80°-89° C., the reaction was terminated, the mixture cooled to room temperature, and the latex then dried under nitrogen with stirring at 69°-70° C. The residue weighed 110.5 g (98% yield). It was ground in a mortar and held for one day over concentrated aqueous ammonium hydroxide, then for one day over sodium hydroxide pellets. The treated powder ($T_g = \sim 130°$ C.) was used to make stable, low-viscosity plastisols like those of Example 12. This example illustrates that polymerizations can be carried out without coagulation at monomer/water ratios as high as 23 parts (by volume) monomer to 77 parts (by weight) water.

EXAMPLE 14

A solution of 0.2 g ammonium persulfate in 100 g water was stirred under nitrogen and to it was added 29 ml of a solution of 5 g methacrylic acid plus 2 g dodecyl mercaptan in 95 g methyl methacrylate. The suspension was held at 80°-90° C. for 30 minutes, then at 30-minute intervals was added 20 ml of the methacrylic acid/dodecyl mercaptan/methyl methacrylate solution plus 80 ml of a solution of 0.1 g ammonium persulfate in 320 ml water. Thirty minutes after the fourth such addition, the latex was evaporated under nitrogen with stirring at 65° C. The resultant solid was ground in a mortar, passed through a 40-mesh ($\sim 0.38$ mm) sieve, held one day over concentrated aqueous ammonium hydroxide, then one day over sodium hydroxide pellets. The polymer powder had $T_g = \sim 113°$ C.

A mixture of 87.5 g trimethylolpropane trimethacrylate, 20.0 g tricresyl phosphate, 10.0 g bis(2-o-chlorophenyl-4,5-diphenyl)imidazole, 0.5 g leuco crystal violet, 0.5 g benzotriazole, 0.375 g C. I. Solvent Red 109, and 0.125 g Michler's ketone was stirred for about 16 hours at room temperature, then milled for 30 minutes at 0° C. under nitrogen with 100 ml of 20-30 mesh ($\sim 0.55$-$0.85$ mm) sand, and pressure-filtered through nylon flannel. An 11.9 g sample of this premix was stirred at 0° C. and 11.1 g of the polymer powder made as just described was added portionwise. The resultant soft paste was held for 20 hours at room temperature. It became a flowable dispersion with a Brookfield No. 5 viscosity of 15,440 cps. at 20 rpm. An equal volume of 20-30 mesh ($\sim 0.55$-$0.85$ mm) sand was added, and the suspension was milled for 30 minutes at 0° C. under nitrogen. It was then pressure-filtered through a 325-mesh (0.044 mm) screen. The filtrate had a Brookfield No. 5 viscosity of 18,200 cps. and remained uncoalesced for many days at room temperature. It was coated, coalesced at 120° C., laminated, imaged, developed, etched and stripped as described for preceding examples.

EXAMPLE 15

To a solution of 0.2 g ammonium persulfate in 100 g water was added 29 ml of a solution of 5 g methacrylic acid and 2 g dodecyl mercaptan in 95 g methyl methacrylate. The suspension was blanketed with nitrogen, stirred and heated under reflux at 80°-90° C. At 30-minute intervals, there was added 20 ml of the methyl methacrylate/methacrylic acid/dodecyl mercaptan solution plus 80 ml of a solution of 0.1 g ammonium persulfate in 320 ml water. Thirty minutes after the fourth such addition, the reaction was terminated by opening to air and cooling to room temperature. A portion of the resultant milky latex was evaporated to dryness. The residue comprised 99% of the theoretical yield for complete polymerization.

A second polymerization was carried out as just described except that the initial charge comprised 0.2 g ammonium persulfate, 79.6 g water, and 20.4 g of the latex of the first polymerization to provide 4 g of polymer seed, i.e., 4% of the weight of the methyl methacrylate/methacrylic acid/dodecyl mercaptan used in the second polymerization.

After the second polymerization was complete, the latex was evaporated to dryness under nitrogen with stirring in a 55° C. water bath. The residue weighed 104 g (98% yield). It was ground in a mortar and passed through a ⅛inch-mesh (3.2 mm) sieve. A 33.5 g. portion was loaded into a column and anhydrous ammonia gas was passed slowly through the bed of powder for 30 minutes. Weight gain was 2.1%, vs. a theoretical maximum of 1.2% for complete conversion of the available —COOH groups to —COONH$_4$, the excess probably being attributable to adsorption.

A solution of 48 g tricresyl phosphate, 16.0 g benzophenone, 0.8 g Michler's ketone, 0.8 g bis(2-o-chlorophenyl-4,5-diphenyl)imidazole, 0.8 g benzotriazole, 0.4 g tris(4-diethylamino-o-tolyl)methane, 0.2 g leuco crystal violet, and 0.28 g C. I. Basic Blue 7 (C. I. No. 42595) in 120 g trimethylolpropane triacrylate that contained 500 ppm hydroquinone was prepared by stirring for about 16 hours at room temperature. To 11.7 g of this solution there was added portionwise with stirring 12.5 g of the ammonia-treated binder powder. The suspension was cooled in an ice bath and blanketed with nitrogen, and 20 ml of 20-30 mesh ($\sim 0.55$-$0.85$ mm) sand was added portionwise with disc-stirring at 1000 ft./min. ($\sim 300$ m/min.) peripheral speed. After stirring for one hour, the plastisol was separated from the sand by filtration through nylon flannel and was found to have a Brookfield No. 5 viscosity of 820 cps. at 20 rpm initially, 1400 cps. after standing 24 hours at room temperature, and 2460 cps. after further stirring after 24 hours at room temperature. It was used to make photoimaging circuit board resists in the manner previously described.

I claim:

1. In an emulsion polymerization process for the preparation of methyl methacrylate polymers and copolymers containing at least 60% by weight of methyl methacrylate units, which comprises (a) adding stepwise in two or more steps with vigorous mixing in water at least one monomer which is methyl methacrylate, together with a polymerization initiator and chain transfer agent whereby at least most of the monomer added in any given step is consumed before the addition of the next succeeding portion, and (b) isolating the resulting polymer; the improvement which comprises the stepwise addition in step (a) occurring in the absence of any emulsifier and surfactant, and the isolation step (b) occurring at a temperature that is at least 30° C. below the glass transition temperature of the polymer product.

2. A process according to claim 1 wherein the methyl methacrylate polymers and copolymers contain at least 80% by weight of methyl methacrylate units.

3. A process according to claim 1 wherein the methyl methacrylate copolymer contains at least 1% by weight of methacrylic acid units.

4. A process according to claim 1 wherein the chain transfer agent is an alkyl mercaptan wherein the alkyl group is of at least 10 carbon atoms.

5. A process according to claim 4 wherein the alkyl group of the chain transfer agent is of 12 carbon atoms.

6. A process according to claim 1 wherein substantially all the monomer added in any given step is completely consumed before more monomer is added in the next succeeding step.

7. A process according to claim 1 wherein isolation step (b) occurs at a temperature that is at least 40° to 50° C. below the glass transition temperature of the polymer product.

8. A process according to claim 1 wherein the methyl methacrylate polymers have molecular weights in the range of about 20,000 to greater than 325,000, inherent viscosities in the range of 0.1 to 1.5, and average particle sizes in the range of 0.1 to 20 μm.

9. A process for the preparation of plastisols and organosols which comprises
   (1) preparing methyl methacrylate polymers and copolymers containing at least 60% by weight of methyl methacrylate units by an emulsion polymerization process which comprises
      (a) adding stepwise in two or more steps with vigorous mixing in water, in the absence of any emulsifier and surfactant, at least one monomer which is methyl methacrylate, together with a polymerization initiator and chain transfer agent whereby at least most of the monomer added in any given step is consumed before the addition of the next succeeding portion, and
      (b) isolating the resulting polymer at a temperature that is at least 30° C. below the glass transition temperature of the polymer product; and
   (2) dispersing the isolated methyl methacrylate polymers and copolymers in a surfactant-free medium that comprises a compatible liquid plasticizer that is nonvolatile at room temperature and is not a monomer of any of the polymeric components.

10. A process according to claim 9 wherein in the liquid phase of the dispersion there is present a volatile component in an amount of 5 to 40% by volume.

11. A process according to claim 10 wherein the volatile component is a solvent for the methyl methacrylate polymers and copolymers.

12. A process according to claim 10 wherein the volatile component is a swelling agent for the methyl methacrylate polymers and copolymers.

13. A process for the preparation of photosensitive plastisols and organosols which comprises
   (1) preparing methyl methacrylate polymers and copolymers containing at least 60% by weight of methyl methacrylate units by an emulsion polymerization process which comprises
      (a) adding stepwise in two or more steps with vigorous mixing in water, in the absence of any emulsifier and surfactant, at least one monomer which is methyl methacrylate, together with a polymerization initiator and chain transfer agent whereby at least most of the monomer added in any given step is consumed before the addition of the next succeeding portion, and
      (b) isolating the resulting polymer at a temperature that is at least 30° C. below the glass transition temperature of the polymer product; and
   (2) dispersing said isolated polymers and copolymers in a surfactant-free medium that comprises a compatible liquid plasticizer that is nonvolatile at room temperature and is not a monomer of any of the polymeric components, a photopolymerizable ethylenically unsaturated monomeric compound, and at least one photoinitiator.

14. A process according to claim 13 wherein the monomeric compound is a polyfunctional acrylic or methacrylic monomer.

15. A process according to claim 14 wherein the monomeric compound is trimethylolpropane triacrylate.

16. A process according to claim 14 wherein the monomeric compound is trimethylolpropane trimethylacrylate.

17. A process according to claim 13 wherein polymer particles, either of the same composition as the final polymer or derived from a related monomeric species used in making the final polymer, are present in the first stepwise addition of monomer in step (a), the polymer particles being present in an amount of 0.5 to 10% by weight based on the weight of final polymer.

* * * * *